United States Patent [19]
Kiefer

[11] Patent Number: 5,459,401
[45] Date of Patent: Oct. 17, 1995

[54] MRI METHOD FOR PRODUCING IMAGES HAVING WEAK THROUGH MEDIUM T2 WEIGHING EMPLOYING A TURBO-SPIN ECHO SEQUENCE

[75] Inventor: Berthold Kiefer, Erlangen, Germany

[73] Assignee: Siemens Aktiengesellschaft, Munich, Germany

[21] Appl. No.: 250,529

[22] Filed: May 31, 1994

[30] Foreign Application Priority Data

Jun. 1, 1993 [DE] Germany ............ 43 18 212.7

[51] Int. Cl.$^6$ .................................... G01R 33/48
[52] U.S. Cl. ............................ 324/309; 324/307
[58] Field of Search ................ 324/307, 309, 324/300; 128/653.2

[56] References Cited

U.S. PATENT DOCUMENTS

| | | | |
|---|---|---|---|
| 4,521,733 | 6/1985 | Bottomley et al. | 324/309 |
| 4,697,148 | 9/1987 | Ströbel et al. | 324/309 |
| 4,818,940 | 4/1989 | Hennig et al. | 324/309 |
| 5,001,429 | 3/1991 | Constable et al. | 324/307 |
| 5,162,730 | 11/1992 | Schmitt et al. | 324/309 |
| 5,168,226 | 12/1992 | Hinks | 324/309 |
| 5,270,654 | 12/1993 | Feinberg et al. | 324/309 |
| 5,304,929 | 4/1994 | Fang et al. | 324/309 |
| 5,349,292 | 9/1994 | Sugiura | 324/309 |
| 5,361,028 | 11/1994 | Kanayama et al. | 324/307 |

OTHER PUBLICATIONS

"RARE Imaging: A Fast Imaging Method for Clinical MR," Hennig et al., Magnetic Resonance in Medicine 3, pp. 823–833 (1986).

"Phase–encode order and its effect on contrast and artifact in single–shot RARE Sequences," Mulkern et al., Medical Physics, vol. 18, 5, Sep./Oct. 1991, pp. 1032–1037.

"Fast Spin Echo with Use of Half Scanning," Nishimura et al., SMRM–Abstract Volume, Eleventh SMRM, Berlin, 1992, p. 4524.

*Primary Examiner*—Sandra L. O'Shea
*Assistant Examiner*—Raymond Y. Mah
*Attorney, Agent, or Firm*—Hill, Steadman & Simpson

[57] ABSTRACT

In a pulse sequence according to the turbo-spin echo method, only a part of the raw data matrix (MR) that lies asymmetrically relative to a zero line and that contains this zero line is filled with samples, whereby phase-coding gradients (GPS) are switched such that the echo signals that are only slightly dephased by the phase-coding gradient are acquired closely following a radio-frequency excitation pulse (RF1). These signals are thus entered into the central lines of the raw data matrix (MR) which are the ruling factor in determining the weighting of the reconstructed image.

5 Claims, 4 Drawing Sheets

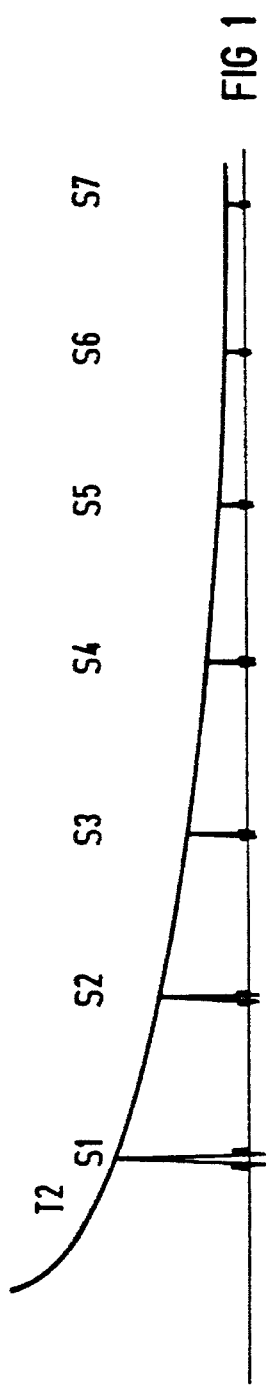
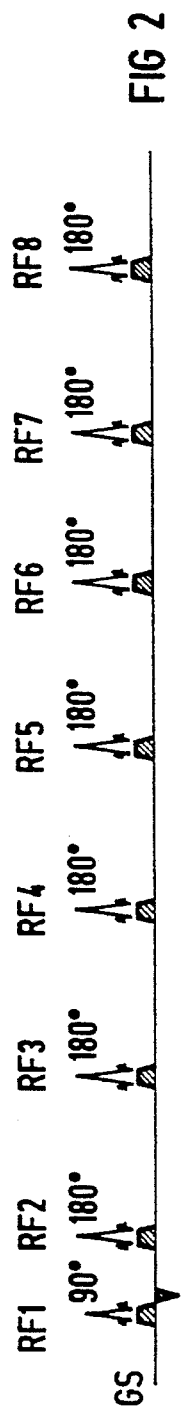
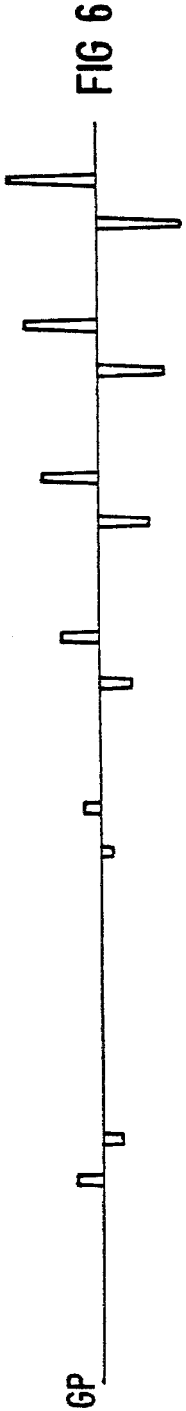

MRI METHOD FOR PRODUCING IMAGES HAVING WEAK THROUGH MEDIUM T2 WEIGHING EMPLOYING A TURBO-SPIN ECHO SEQUENCE

BACKGROUND OF THE INVENTION

1. Field of the Invention

The present invention is directed to a method for producing an image employing a magnetic resonance imaging apparatus, and in particular to a method based on the turbo-spin echo sequence.

2. Description of the Prior Art

European Application No. 0175184 discloses pulse sequence wherein a 90° excitation radio-frequency pulse is followed by a plurality of 180° radio-frequency pulses which function as refocusing pulses. A spin echo signal follows each refocusing pulse. An image of the examination subject can be reconstructed from the acquired signal after phase-coding and read-out using known image reconstruction methods.

A sufficient number of echo signals can be acquired after a single excitation, using this known method, so that the image acquisition of a complete slice of the examination subject is possible. A pulse sequence of this type is known in the art as a "single-shot sequence." A problem with such known sequences, however, is that the amplitude of the echo signals decreases after the excitation dependent on the transverse relaxation time $T_2$. When the echo signals are phase-coded in a conventional manner so that they are entered into the raw data matrix from the first to the last matrix line according to their sequence after the excitation, i.e., the effective phase-coding gradient proceeds from the highest negative value to the highest positive value or vice-versa, an extremely pronounced $T_2$ weighting of the image arises. Such a pronounced $T_2$ weighting is undesirable in many instances. It is essentially the middle line of the raw data matrix, i.e. the zero line, which is the controlling or predominant factor for the weighting of the resulting image. Because these samples which are entered in this middle line are measured relatively long after the excitation, given the aforementioned conventional sorting of the signals for entry into the raw data matrix, the pronounced $T_2$ weighing arises. The sequence of the filling of the signals in the raw data matrix also influences the contrast of the acquired image and the presence of artifacts in the acquired image. This is described in the article "RARE Imaging: A Fast Imaging Method for Clinical MR," in Magnetic Resonance in Medicine 3, pages 823–833 (1986), as well as in the article "Phase-Encode Order and its Effect on Contrast and Artifact in Single-Shot RARE Sequences," in Medical Physics Vol. 18, No. 5, September/October 1991, pages 1032–1037. This second article also discusses the influence on the $T_2$ weighting. It is proposed, for example, that the $T_2$ weighting be diminished by coding the first echo signal after the excitation with a medium, negative phase-coding value, which is sequentially raised from echo-to-echo until the highest positive phase-coding value is reached. The remaining echoes are thereafter coded using the previously skipped, negative phase-coding values, beginning with the highest negative phase-coding value. This can be considered to be a chronological rotation of the echoes allocated to the zero line.

This type of filling, however, results in a considerable amplitude discontinuity in the raw data matrix between two neighboring lines. A so called "banding" artifact is thus caused. Moreover, additional artifacts occur in this method, as described in the aforementioned article.

The article "Fast Spin Echo with Use of Half Scanning," in the SMRM-Abstract Volume, 11th SMRM, Berlin, 1992, page 4524 states that more measuring time can be saved in turbo-spin echo sequences if only half of the Fourier space is scanned. The echo signals are thereby entered into the raw data matrix in the conventional way, i.e. beginning with the first signal after the excitation being entered in the first line of the raw data matrix. This article, however, does not refer to a "single-shot" sequence, but rather to a multiple excitation sequence.

SUMMARY OF THE INVENTION

It is an object of the present invention to provide a method for producing MR images employing a turbo-spin echo pulse sequence in combination with single-shot techniques, such that the $T_2$ weighting of the image is reduced, and at the same time substantially avoiding image artifacts.

The above object is achieved in accordance with the principles of the present invention in a method for operating a nuclear magnetic tomography apparatus wherein an examination subject is subjected to an RF excitation pulse, followed by the acquisition of a sufficient number of echo signals by the repeated application of RF refocusing pulses in order to enable the reconstruction of an image. The echo signals are respectively differently phase-coded by generating a respective phase-coding gradient in a first direction preceding each spin echo signal. Each echo signal is sampled under a readout gradient, and the digitized samples are entered into respective lines of a raw data matrix. Only a part of the raw data matrix, however, which lies asymmetrically relative to the matrix zero line that's the central line of the raw data matrix, and which contains this zero line, is filled with samples. The aforementioned phase-coding gradients are switched such that the echo signals which are only slighting dephased by the phase-coding gradients are acquired closely following the RF excitation pulse. An image is then reconstructed from the raw data matrix using a half-Fourier method.

By definition, the zero line of the raw data matrix is the line disposed exactly in the center of the matrix, and is allocated to the phase-coding gradient having a value of zero. Given the type of ordering of the measured signals in rawdata matrix which is conducted in accordance with the invention, an echo signal which follows closely after the excitation pulse, and thus exhibits a weak through medium $T_2$ weighting, is entered in the zero line of the raw data matrix. Strong amplitude discontinuities are avoided by ordering the echoes chronologically in rawdata matrix so that the aforementioned banding artifacts do not occur.

DESCRIPTION OF THE DRAWINGS

FIGS. 1–5 illustrate a known turbo-spin echo sequence according to the half-Fourier method having conventional filling of the echo signals into the raw data matrix.

FIGS. 6 and 7 illustrate a turbo-spin echo sequence having a filling of the echo signals into the raw data matrix in accordance with the principles of the present invention.

DESCRIPTION OF THE PREFERRED EMBODIMENTS

FIGS. 1–4 show a known pulse sequence referred to in the art as a "turbo-spin echo sequence." As shown in FIG. 2, a 90° radio-frequency pulse RF1 is first generated for exciting nuclear spins in an examination subject. This is followed by a plurality of 180° radio-frequency pulses RF2-RF8, each of which respectively effects a refocusing of the nuclear spins, and thus cause nuclear magnetic resonance signals S1-S7 to arise in the form of echo signals. All of the radio-frequency pulses RF1-RF8 are generated under the influence of slice selection gradients GS, so that they respectively act only on nuclear spins within a designated slice of the examination subject. Without taking the phase-coding gradient GP into consideration, as shown in FIG. 1, the amplitude of the spin echoes S1-S7 decreases with a time constant $T_2$. For frequency-coding of the spin echoes S1-S7, a read-out gradient GR shown in FIG. 3 is activated for the duration of each spin echo. For a topical resolution in a second direction, each spin echo S1-S7 is individually phase-coded. This is achieved by the phase-coding gradient GP shown in FIG. 4, which precedes each spin echo S1-S7. The phase shift caused by the phase-coding gradient GP is in turn cancelled by a phase-coding gradient of the opposite direction which follows each spin echo S1-S7.

Such a method is known from the article "Fast Spin Echo with Use of Half Scanning," in the aforementioned SMRM-Abstract Volume, 11th SMRM, Berlin, 1992. The pulse sequence according to FIGS. 2–4 is implemented multiple times, with respectively different values of the phase-coding gradient being employed in the repetitions, since the entire Fourier space is not yet scanned after a single excitation. This known method is therefore not representative of the type of technique known as the "single-shot" technique.

Each of the spin echoes S1-S7 is sampled, the samples are digitized, and are entered into a line of a raw data matrix. Each line of the raw data matrix corresponds to a specific phase-coding, i.e., to a dephasing of the echo signal prescribed by the effective phase-coding gradient GP. The dephasing thus changes from the first line to the last line of the raw data matrix in equal steps from a maximum positive value to a maximum negative value. Signals having zero dephasing are entered in the middle line of the raw data matrix.

Figure 5:
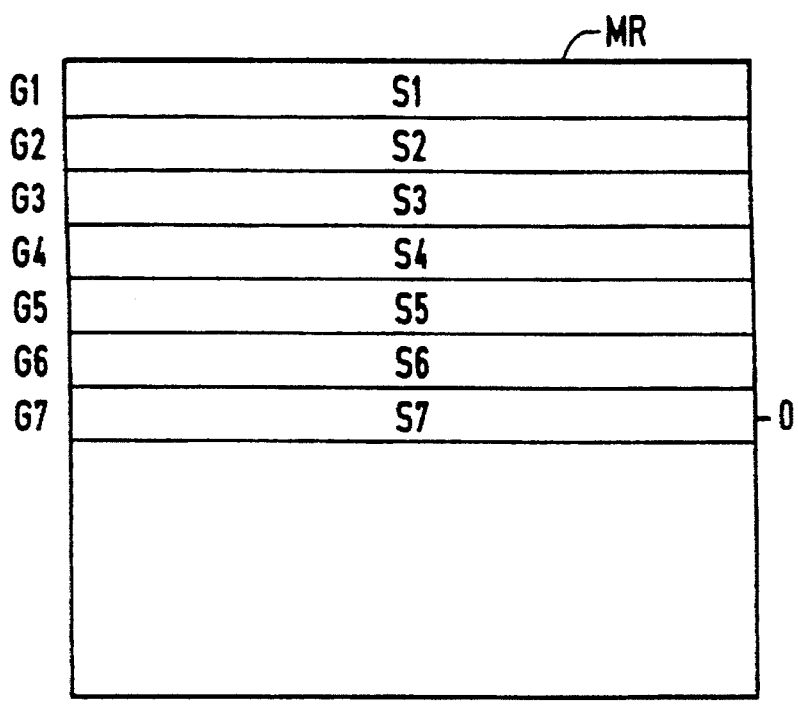

In the half-Fourier method, only somewhat more than half of the raw data matrix is filled (the upper half in the illustrated case shown in FIG. 5). The lines at the upper edge region of the raw data matrix, i.e., lines having the lowest line number, may, as an alternative, not be filled with measured values in order to further save measuring time. This is known as the "reduced lines" method and is employed in magnetic resonance imaging systems which are currently available. Corresponding to the number of signals acquired per pulse sequence, the part of the raw data matrix to be occupied is divided into seven line groups, whereby the first signal S1 of each pulse sequence is entered into the first line group, the second signal S2 of each pulse sequence is entered into the second line group, etc. The pulse sequence is implemented sufficiently often with different phase-coding gradients until all lines of a line group are occupied. In this known method, therefore, the signals and the edge lines of the raw data matrix, i.e., the signals having the highest dephasing, are acquired in each pulse sequence closely following the RF excitation pulse RF1, whereas the signals in the middle lines of the raw data matrix, i.e. the signals having the least dephasing, are acquired at the longest chronological spacing from the RF excitation pulse.

The middle line in the raw data matrix is conventionally referred to as the zero line, and the other lines are sequentially numbered with positive or negative operational signs in the upward and downward directions.

An image can be acquired from the raw data matrix shown in FIG. 5 in a known manner using a two-dimensional Fourier transformation and using a half-Fourier method, as described below.

As can be seen in FIG. 1, each of the spin echoes S1-S7 has a different amplitude, dependant on the time constant $T_2$, i.e., the spin echoes S1-S7 are differently $T_2$-weighted. The weighting of the image to be reconstructed from the raw data matrix is essentially defined by the chronological position of the echo at which the phase-coding gradient has the lowest amplitude, i.e., at which the echo signal is least dephased. In the exemplary embodiment of FIGS. 1–5, this is the echo signal S7. The chronological spacing between the 90° excitation pulse and this echo signal S7 is referred known as the effective echo time $TE_{eff}$. Because the echo signal S7, which is entered into the zero line of the raw data matrix, has a large distance (chronological duration) from the radio-frequency excitation pulse RF1, a strong $T_2$ weighting which is undesirable in many instances arises, given the conventional filling of the echo signals into the raw data matrix.

An extremely pronounced $T_2$ weighting is obtained in the initially described "single shot" technique, because in a very long echo train the echo, located in the center of the rawdata matrix has a large distance from the RF excitation pulse. This pronounced $T_2$ weighting can be avoided in the pulse sequence of the invention, which is described below with respect to an exemplary embodiment.

The inventive pulse sequence includes the pulses shown in FIGS. 1–3, as described above. Departing therefrom, a "single-shot" technique is employed, whereby all echo signals for the raw data matrix are acquired after a single RF excitation pulse RF1. Significantly more than the illustrated seven echo signals are therefore acquired in practice. For clarity, however, it is assumed below that an image is generated from only seven lines of the raw data matrix, and that only seven differently phase-coded echo signals S1-S7 are acquired.

Figure 7:
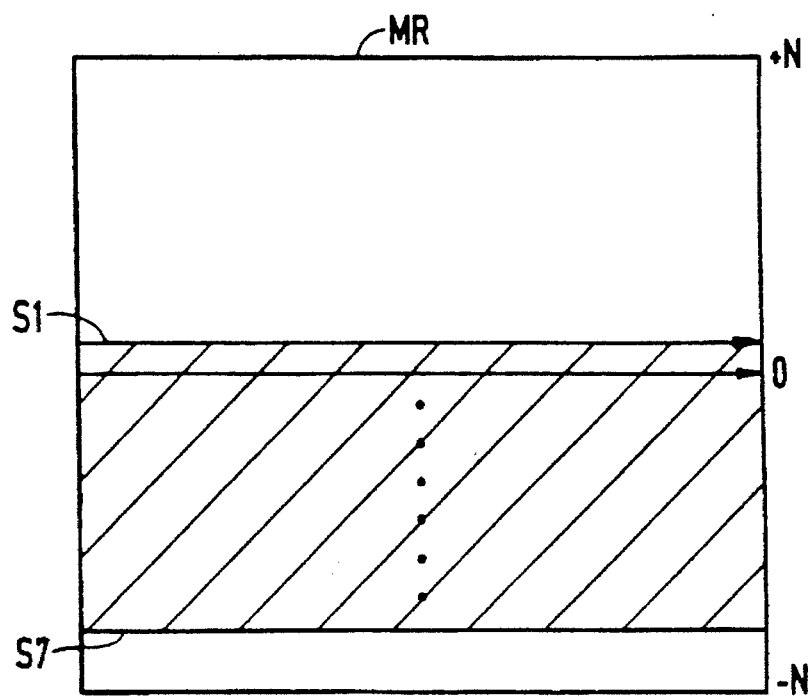

The $T_2$ weighting is reduced because the spin echo signals in the half-Fourier technique are entered into the raw data matrix beginning in the proximity of the zero line of the matrix. The course of the phase-coding gradient required for this purpose is shown in FIG. 6. The first spin echo S1 is thus only slightly dephased (i.e. phase-coded in the positive direction), the second echo signal is not phase-coded and thus comes to lie in the zero line according to FIG. 7, whereas the following echo signals S3-S7 are increasingly phase-coded in negative direction, and are thus entered into the lines of the raw data matrix shown in FIG. 7 farther toward the bottom. Additional measuring time can be saved if the lowest lines of the raw data matrix MR, i.e. the lines having the highest negative line numbers, are not occupied with measured values. For the reasons described below, however, it is important that the zero line be occupied with measured values. A region of the raw data matrix which lies asymmetrically relative to the zero line, and which contains the zero line, is thus filled with measured values in accordance with the inventive method.

The echo signal S2 entered into the zero line of the raw data matrix is only weakly $T_2$-weighted, so that an image having low $T_2$ weighting is obtained overall. A particular advantage of the inventive method is that no significant change in the amplitudes of the spin echoes occurs from line-to-line, so that the banding artifacts arising in the aforementioned prior art methods are avoided.

In accordance with the inventive method, therefore, only a part of the Fourier space is scanned. The raw data matrix is theoretically complex-symmetrically conjugated around the zero line. The zero line must always be included in the measurement because it contains low frequencies which contain information about the rough structure of the measured subject, and are the controlling factor influencing the signal-to-noise ratio. In practice, however, the position of the zero line cannot be exactly defined on the basis of the measurement, because it is falsified by inhomogeneities in the basic magnetic field, as well as by eddy currents and by gradient offsets. When the zero line does not lie exactly in the middle of the raw data matrix, and the spin echoes do not lie exactly in the middle of each line, a phase shift occurs in the Fourier-transformed data in line direction or in the column direction. When the complete raw data matrix is measured, this phase shift can be averaged out by using both the real and imaginary parts of the signal for the evaluation, and a normalization can then be implemented. If, however, only a part of the Fourier lines are measured, lying asymmetrically relative to the zero line, the phase shift must be corrected in some other way in order to obtain good image quality.

Figure 8:
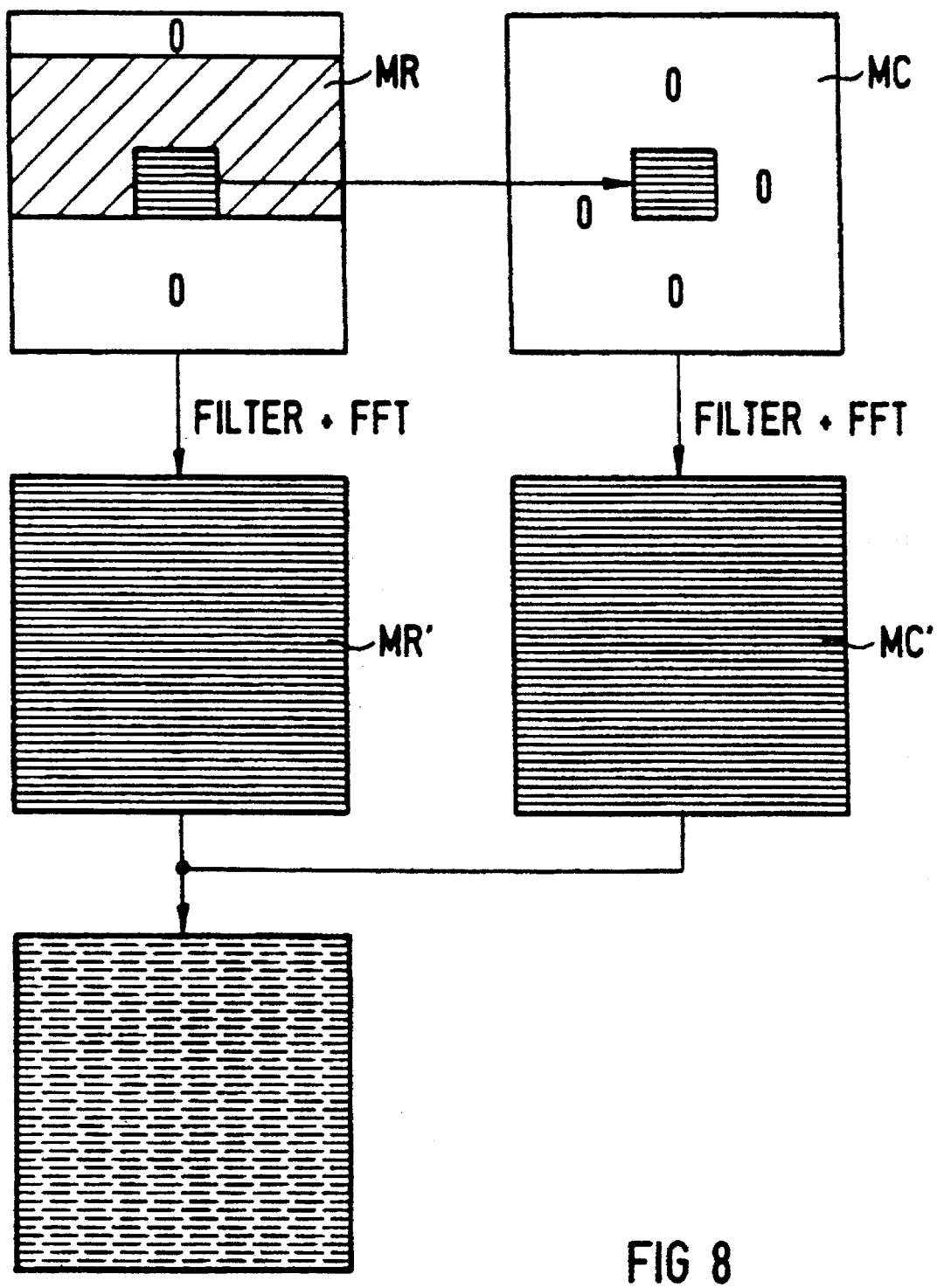
FIG. 8 is a diagram illustrating an image reconstruction according to the half-Fourier method.

A few lines beyond the zero line of the raw data matrix MR, i.e. lines at both sides of the zero line, are therefore measured. As shown in the flow chart of FIG. 8, the central columns of the lines are placed around the zero line in the middle of a correction matrix MC, having the size of the desired image matrix. The remaining region of this correction matrix MC is filled with zeroes. Subsequently, this correction matrix is Fourier-transformed. In order to avoid image artifacts which arise due to the filling of the outer regions with zero, a linear filter (for example, a Hanning filter) is employed before the Fourier transformation. The lines in the raw data matrix MR which are not filled with measured values are also filled with zeroes, in order to obtain a quadratic matrix; these lines are likewise filtered and Fourier-transformed. The matrix obtained in this manner is multiplied by the conjugate-complex, normalized correction matrix MC', and the absolute real part is employed for the image data. As a consequence of the correction which has been applied, the phase and, thus the imaginary part, should be zero and should thus be equal to the real part in terms of magnitude.

Figure 9:
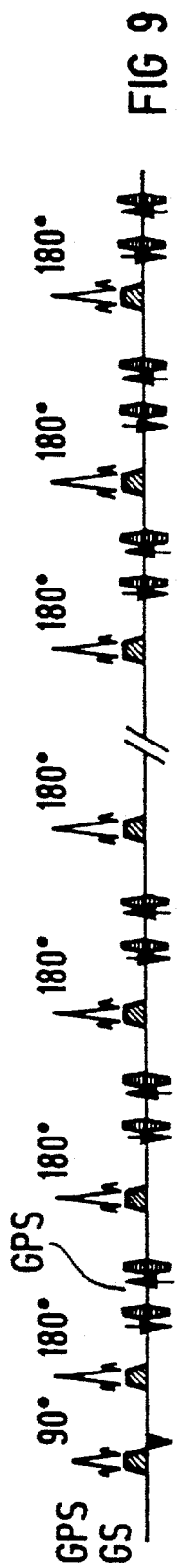
FIGS. 9–11 illustrate a corresponding pulse sequence for three-dimensional imaging.
Figure 10:
Figure 11:
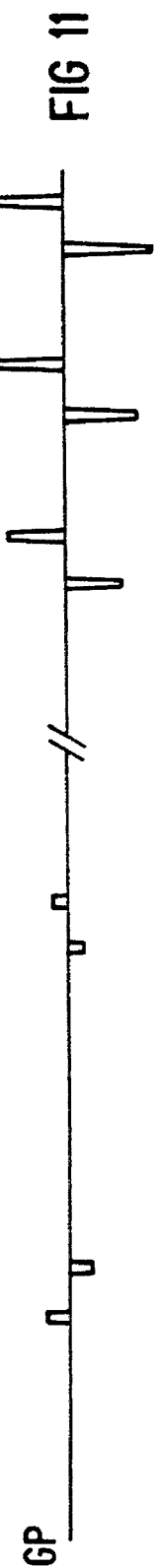

The method can also be expanded to three-dimensional imaging. FIGS. 9–11 show a corresponding pulse sequence for this purpose. A 90° radio-frequency excitation pulse RF1 is again followed by a sequence of refocusing pulses RF2-RF8, which generate corresponding spin echoes S1-S7. The coding of the spin echoes S1-S7 by the phase-coding gradients GP and by the read out gradients GR ensues as in the exemplary embodiment of FIGS. 1–6. Differing therefrom, however, a further phase-coding gradient GPS is activated in the slice selection direction preceding each spin echo S1-S7, and the spins are again rephased after each spin echo S1-S7 by an oppositely directed gradient. The selected excitation extends in this embodiment to thicker slices (slabs) in which a topical selection in the slice direction also ensues due to the additional phase-coding gradient in slice selection direction. The phase-coding gradients GPS in the slice selection direction are constant for the spin echoes S1-S7. The illustrated pulse sequence, however, is implemented N times with N different values of the gradient in the slice selection direction. A three-dimensional raw data matrix, from which an image is acquired by three-dimensional Fourier transformation, is thus produced.

Although modifications and changes may be suggested by those skilled in the art, it is the intention of the inventor to embody within the patent worded hereon all changes and modifications as reasonably and properly come within the scope of his contribution to the art.

I claim as my Invention:

1. A method for producing an image of an examination subject in a nuclear magnetic resonance tomography apparatus, comprising the steps of:

subjecting said examination subject to an RF excitation pulse to excite nuclear spins in said examination subject;

following said RF excitation pulse, subjecting said examination subject to a plurality of RF refocusing pulses, each refocusing pulse causing the generation of an echo signal, said plurality of refocusing pulses being sufficient to generate a corresponding plurality of echo signals for reconstructing an image;

respectively differently phase-coding each echo signal by preceding each echo signal with a phase-coding gradient in a first direction, thereby resulting in said echo signals being respectively differently dephased;

sampling each echo signal under a read-out gradient to obtain a plurality of sampled signals;

digitizing said sampled signals to obtain digitized samples;

entering said digitized samples into respective lines of a raw data matrix, said raw data matrix having a zero line;

ordering the entry of said digitized samples into said lines of said raw data matrix by filling only a part of said raw data matrix lying asymmetrically relative to said zero line and containing said zero line with said digitized samples, whereby the echo signals which are only slightly dephased by said phase-coding gradient are acquired closely following said RF excitation pulse; and reconstructing an image from said raw data matrix by a half-Fourier transformation.

2. A method as claimed in claim 1 wherein the step of phase-coding said echo signals is further defined by phase-coding said echo signals in a sequence following said RF excitation pulse beginning with a small dephasing in identical steps up to a pronounced dephasing in an opposite direction.

3. A method as claimed in claim 1 comprising the additional step of selecting said RF refocusing pulses for causing a flip angle of less than 180°.

4. A method as claimed in claim 1 comprising the additional steps of:

repeating the method steps N times;

activating a phase-coding gradient which is identical for all echo signals of a pulse sequence before each echo signal in a third direction which is perpendicular relative to perpendicular first and second directions;

rephasing said spins after each echo signal by generating an oppositely directed phase-coding gradient;

changing said phase-coding gradient in said third direction in N steps from pulse sequence-to-pulse sequence; and entering said digitized samples into a three-dimensional raw data matrix and acquiring said image using a three-dimensional Fourier transformation.

5. A method as claimed in claim 1 comprising the additional step of generating said RF excitation pulses and said RF refocusing pulses under the influence of a slice-selection gradient.

* * * * *